United States Patent
Li et al.

(10) Patent No.: US 10,015,591 B2
(45) Date of Patent: Jul. 3, 2018

(54) PICKUP APPARATUS AND PICKUP METHOD

(71) Applicant: Huawei Technologies Co., Ltd., Shenzhen (CN)

(72) Inventors: Yulong Li, Shenzhen (CN); Jingfan Qin, Shenzhen (CN); Hui Wang, Hangzhou (CN); Xiaohong Dong, Shenzhen (CN); Yunneng Mo, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/383,167

(22) Filed: Dec. 19, 2016

(65) Prior Publication Data

US 2017/0105067 A1 Apr. 13, 2017

Related U.S. Application Data

(63) Continuation of application No. PCT/CN2015/080182, filed on May 29, 2015.

(30) Foreign Application Priority Data

Jun. 19, 2014 (CN) .......................... 2014 1 0277225

(51) Int. Cl.
  *H03M 1/00* (2006.01)
  *H04R 3/00* (2006.01)
  *H03G 11/00* (2006.01)

(52) U.S. Cl.
  CPC ........... *H04R 3/005* (2013.01); *H03G 11/008* (2013.01); *H04R 2430/01* (2013.01)

(58) Field of Classification Search
  CPC ........ H03M 1/188; H03M 1/187; H03M 1/12; H03M 1/18; H03M 1/70; H03M 1/1215;
(Continued)

(56) References Cited

U.S. PATENT DOCUMENTS 5,714,956 A * 2/1998 Jahne .................. H03M 1/1028
                                                                341/139
6,028,946 A * 2/2000 Jahne ...................... H04R 3/00
                                                                381/111
(Continued)

FOREIGN PATENT DOCUMENTS

CN  101128070 A  2/2008
CN  201830414 U  5/2011
(Continued)

OTHER PUBLICATIONS

Machine Translation and Abstract of Chinese Publication No. CN102711006, Oct. 3, 2012, 5 pages.

(Continued)

*Primary Examiner* — Linh Nguyen
(74) *Attorney, Agent, or Firm* — Conley Rose, P.C.

(57) ABSTRACT

A pickup apparatus includes a digital signal processor, at least one microphone, multiple amplifiers, and multiple analog-to-digital converters (ADCs), where each microphone is configured to receive an audio signal, and send the audio signal to an amplifier corresponding to the microphone, each amplifier is configured to amplify the received audio signal, and send the amplified audio signal to an analog-to-digital converter corresponding to the amplifier, each analog-to-digital converter is configured to convert the received audio signal into a digital signal, and send the digital signal to the digital signal processor, and the digital signal processor is configured to receive multiple digital signals sent by the multiple analog-to-digital converters, determine an unclipped digital signal from the multiple received digital signals, and determine an output signal according to a gain value corresponding to the unclipped digital signal. The pickup apparatus disclosed in the present (Continued)

disclosure may have excellent pickup performance in various pickup scenarios.

17 Claims, 9 Drawing Sheets

(58) Field of Classification Search
CPC .... H03M 1/124; H03M 1/1295; H03M 1/185; H03M 3/458; H03M 3/488; H04R 3/005; H04R 2201/401; H04R 25/00; H04R 3/02; H04R 2430/20; H04R 2430/23; H04R 1/406; H04R 2225/67; H04R 2410/05; H04R 25/356; H04R 25/502
USPC ........ 341/139, 140, 142, 155; 381/122, 126, 381/133, 111, 92
See application file for complete search history.

(56) References Cited

U.S. PATENT DOCUMENTS

| | | | |
|---|---|---|---|
| 8,223,981 | B2 | 7/2012 | Haila et al. |
| 8,638,249 | B2 * | 1/2014 | Kropfitsch ............. H03G 3/002 329/347 |
| 2008/0037451 | A1 * | 2/2008 | Yagunov ............... H04M 9/082 370/289 |
| 2008/0205668 | A1 | 8/2008 | Torii et al. |
| 2009/0003634 | A1 * | 1/2009 | Kushida ................. H04R 1/403 381/300 |
| 2010/0176980 | A1 * | 7/2010 | Breitschadel ......... H03M 1/188 341/155 |
| 2010/0254541 | A1 * | 10/2010 | Hayakawa .......... G10L 21/0208 381/71.1 |
| 2010/0254545 | A1 | 10/2010 | Hosomi |
| 2011/0069846 | A1 * | 3/2011 | Cheng .................... H04R 3/005 381/92 |
| 2012/0250881 | A1 * | 10/2012 | Mulligan .............. H03F 1/0261 381/92 |
| 2012/0321100 | A1 | 12/2012 | Haila et al. |
| 2015/0222997 | A1 * | 8/2015 | Fang ...................... H04R 25/50 381/321 |
| 2015/0281836 | A1 * | 10/2015 | Nguyen ................... H04R 3/00 381/120 |
| 2015/0356964 | A1 * | 12/2015 | Ono ....................... H04R 3/005 381/71.1 |
| 2016/0088418 | A1 * | 3/2016 | Sato ..................... G10K 11/346 381/17 |
| 2016/0150325 | A1 * | 5/2016 | Oliaei ................... H04R 1/406 381/111 |

FOREIGN PATENT DOCUMENTS

| | | |
|---|---|---|
| CN | 102711006 A | 10/2012 |
| CN | 103079143 A | 5/2013 |
| CN | 103475980 A | 12/2013 |
| CN | 203631134 U | 6/2014 |
| CN | 104066036 A | 9/2014 |
| EP | 2059065 A1 | 5/2009 |
| JP | 1995192097 A | 7/1995 |
| JP | 2013258485 A | 12/2013 |

OTHER PUBLICATIONS

Machine Translation and Abstract of Chinese Publication No. CN104066036, Sep. 24, 2014, 4 pages.
Machine Translation and Abstract of Chinese Publication No. CN103079143, May 1, 2013, 6 pages.
Machine Translation and Abstract of Japanese Publication No. JP2013258485, Dec. 26, 2013, 17 pages.
Koski, A., "Rich Recording Technology Technical Overall Description," Nokia, 2012, 6 pages.
"MEMS Audio Sensor Ultra-Wide Dynamic Range Omnidirectional Digital Microphone," Datasheet, MP34DTW01, Dec. 2012, 15 pages.
Foreign Communication From a Counterpart Application, Chinese Application No. 201410277225.1, Chinese Search Report dated Nov. 21, 2016, 2 pages.
Foreign Communication From a Counterpart Application, European Application No. 15809395.5, Extended European Search Report dated Apr. 25, 2017, 9 pages.
Foreign Communication From a Counterpart Application, Chinese Application No. 201410277225.1, Chinese Office Action dated Dec. 2, 2016, 6 pages.
Foreign Communication From a Counterpart Application, PCT Application No. PCT/CN2015/080182, English Translation of International Search Report dated Aug. 27, 2015, 2 pages.
Foreign Communication From a Counterpart Application, PCT Application No. PCT/CN2015/080182, English Translation of Written Opinion dated Aug. 27, 2015, 7 pages.
Machine Translation and Abstract of Chinese Publication No. CN103475980, Dec. 25, 2013, 13 pages.
Machine Translation and Abstract of Chinese Publication No. CN201830414, May 11, 2011, 8 pages.
Foreign Communication From A Counterpart Application, Chinese Application No. 201410277225.1, Chinese Notice of Rejection dated Dec. 28, 2017, 5 pages.

* cited by examiner

PICKUP APPARATUS AND PICKUP METHOD

CROSS-REFERENCE TO RELATED APPLICATIONS

This application is a continuation of International application No. PCT/CN2015/080182, filed on May 29, 2015, which claims priority to Chinese Patent Application No. 201410277225.1, filed on Jun. 19, 2014, the disclosure of which is hereby incorporated by reference in its entirety.

TECHNICAL FIELD

Embodiments of the present disclosure relate to the field of audio signal processing, and more specifically, to a pickup apparatus and a pickup method.

BACKGROUND

Recording is one of essential functions of a handheld terminal device such as a mobile phone. A terminal device (also referred to herein as pickup apparatus) 100 shown in FIG. 1 is used as an example. In the pickup apparatus 100, a microphone 101 first performs pickup, and converts a sound signal into an analog electrical signal. Then, the analog electrical signal is transmitted to an amplifier 102, and the amplifier 102 amplifies/adapts a weak analog electrical signal output by a microphone into a system specification range. The amplified analog electrical signal is then transmitted to an Analog-to-Digital Converter (ADC) 103 to implement digitalization conversion of the analog electrical signal. Finally, the recorded data is saved in a memory 104 in the pickup apparatus 100 to facilitate playback later.

For a pickup function such as the foregoing recording, a wide dynamic recording range is an important indicator for measuring pickup quality. For an ideal pickup device, highest volume does not cause that a collected signal is saturated or clipped or even device damage, and lowest volume may also be identified, that is, volume of different amplitudes may be faithfully recorded. As shown in FIG. 2, a maximum sound pressure level (SPL) that may be supported by a common pickup device is generally 115 decibels (dB) to 210 dB, which corresponds to an SPL of a common sound source. Therefore, in a scenario in which a SPL of a sound source is greater than 210 dB_ (for example, a live concert), saturation distortion occurs in an audio signal output by a microphone or a subsequent processing unit in a pickup device, and as a result the pickup device cannot completely perform pickup. On the other hand, in a scenario of a low-volume signal, volume of the sound source is relatively low, and the SPL decreases as a distance between the SPL and the sound source increases. Therefore, to implement pickup of a low-volume signal, the pickup device needs to have high sensitivity and a high signal-to-noise ratio. The high sensitivity means that an extremely weak signal is enough to drive vibrating diaphragm vibration of the microphone for conversion into an electrical signal, and the high signal-to-noise ratio means low enough line noise such that a weak signal is not overwhelmed by noise.

As shown in FIG. 1, a typical pickup apparatus includes a microphone, an amplifier, and an ADC. In this case, it is difficult to consider three indicators at the same time supported maximum sound pressure, a signal-to-noise ratio, and sensitivity. For example, if the pickup device is expected to obtain a high enough signal-to-noise ratio and high sensitivity in a pickup scenario of low volume or typical volume, an electrical signal obtained by means of conversion by the microphone rapidly becomes strong with the enhancement of sound pressure in a case of high sound pressure to exceed a sound pressure supporting capability of the pickup device. In this case, even though a vibrating diaphragm of the microphone does not perform clipping, an analog circuit of a back end performs clipping. However, if the pickup device is expected to have a relatively low signal-to-noise ratio and sensitivity in a scenario of high volume, in a case of low volume, an electrical signal converted by the microphone is overwhelmed by a noise signal and cannot be identified. In conclusion, a technical problem that needs to be urgently resolved in the art is to implement pickup of a relatively large dynamic range such that the pickup device may be applied in both a scenario of high volume and a scenario of low volume.

SUMMARY

Embodiments of the present disclosure provide a pickup apparatus and a pickup method, which may have excellent pickup performance in various pickup scenarios.

According to a first aspect, a pickup apparatus is provided, including a digital signal processor, at least one microphone, multiple amplifiers, and multiple analog-to-digital converters, where the multiple amplifiers are in a one-to-one correspondence with the multiple analog-to-digital converters, each amplifier in the multiple amplifiers corresponds to one microphone in the at least one microphone, and at least two amplifiers that have different gain values from each other and that are in the multiple amplifiers correspond to a same microphone in the at least one microphone, each microphone in the at least one microphone is configured to receive an audio signal, and send the audio signal to an amplifier corresponding to each microphone, each amplifier in the multiple amplifiers is configured to amplify the received audio signal to obtain the amplified audio signal, and send the amplified audio signal to an analog-to-digital converter corresponding to each amplifier, each analog-to-digital converter in the multiple analog-to-digital converters is configured to convert the received audio signal into a digital signal, and send the digital signal to the digital signal processor, and the digital signal processor is configured to receive multiple digital signals sent by the multiple analog-to-digital converters, determine an unclipped digital signal from the multiple received digital signals, and determine an output signal according to a gain value corresponding to the unclipped digital signal.

In a first possible implementation manner, the digital signal processor is configured to determine, as an output signal, a digital signal that corresponds to a maximum gain value and that is in the unclipped digital signal.

With reference to the foregoing possible implementation manner, in a second possible implementation manner, the apparatus further includes a limiter, where two ends of the limiter are respectively connected to at least one amplifier in the multiple amplifiers and a microphone respectively corresponding to the at least one amplifier, and the limiter is configured to receive an audio signal sent by a microphone connected to the limiter, reduce a signal amplitude of the received audio signal, and send, to an amplifier connected to the limiter, the audio signal whose signal amplitude is reduced, and the at least one amplifier is configured to receive the audio signal whose signal amplitude is reduced and that is sent by the limiter respectively connected to the at least one amplifier.

With reference to the foregoing possible implementation manners, in a third possible implementation manner, the at least one microphone is a first microphone, and the first microphone has high sensitivity and high sound overload pressure.

With reference to the foregoing possible implementation manners, in a fourth possible implementation manner, that two ends of the limiter are respectively connected to at least one amplifier in the multiple amplifiers and a microphone respectively corresponding to the at least one amplifier includes the two ends of the limiter are respectively connected to the first microphone and a first amplifier corresponding to the first amplifier, where the multiple amplifiers include the first amplifier, and that at least two amplifiers that have different gain values from each other and that are in the multiple amplifiers correspond to a same microphone in the at least one microphone includes the first microphone is directly connected to at least another two amplifiers in the multiple amplifiers except the first amplifier, where any two amplifiers in the at least another two amplifiers have different gain values.

With reference to the foregoing possible implementation manners, in a fifth possible implementation manner, the at least one microphone includes a second microphone and a third microphone, the second microphone has high sensitivity, and the third microphone has high sound overload pressure, and that at least two amplifiers that have different gain values from each other and that are in the multiple amplifiers correspond to a same microphone in the at least one microphone includes the at least two amplifiers that have different gain values from each other and that are in the multiple amplifiers correspond to the second microphone.

With reference to the foregoing possible implementation manners, in a sixth possible implementation manner, the at least one microphone includes a fourth microphone and a fifth microphone, and the fourth microphone and the fifth microphone have a same physical parameter, and that at least two amplifiers that have different gain values from each other and that are in the multiple amplifiers correspond to a same microphone in the at least one microphone includes N second amplifiers that have different gain values from each other and that are in the multiple amplifiers correspond to the fourth microphone, and N third amplifiers that have different gain values from each other and that are in the multiple amplifiers correspond to the fifth microphone, where the N second amplifiers and the N third amplifiers constitute N amplifier pairs, each amplifier pair in the N amplifier pairs includes one second amplifier and one third amplifier that have a same gain value, and N is an integer greater than 1.

With reference to the foregoing possible implementation manners, in a seventh possible implementation manner, the digital signal processor is configured to perform audio mixing on a first digital signal pair in the multiple received digital signals to obtain an optimized digital signal, where the first digital signal pair is constituted of digital signals respectively corresponding to a second amplifier and a third amplifier that are included in a first amplifier pair, and the N amplifier pairs include the first amplifier pair, and determine an unclipped digital signal from a digital signal set that is constituted of the optimized digital signal and another digital signal, where the other digital signal is a digital signal in the multiple digital signals except the first digital signal pair.

With reference to the foregoing possible implementation manners, in an eighth possible implementation manner, the digital signal processor is further configured to perform volume balance processing on the output signal such that a signal amplitude of the output signal is within an interval of a human ear comfort amplitude.

According to a second aspect, a pickup method is provided, including receiving at least one initial audio signal, performing analog amplification processing and analog-to-digital conversion processing on the at least one initial audio signal to obtain multiple digital signals, where the multiple digital signals include at least two digital signals obtained by a first initial audio signal in the at least one initial audio signal, and gain values that are of any two digital signals in the at least two digital signals and that are relative to the first initial audio signal are different, and determining an unclipped digital signal in the multiple digital signals, and determining an output signal according to a gain value corresponding to the unclipped digital signal.

In a first possible implementation manner, the determining an output signal according to a gain value corresponding to the unclipped digital signal includes determining, as an output signal, a digital signal that corresponds to a maximum gain value and that is in the unclipped digital signal.

With reference to the foregoing possible implementation manner, in a second possible implementation manner, before the performing analog amplification processing and analog-to-digital conversion processing on the at least one initial audio signal to obtain multiple digital signals, the method further includes reducing signal amplitudes of some or all signals in the at least one initial audio signal, and the performing analog amplification processing and analog-to-digital conversion processing on the at least one initial audio signal includes performing analog amplification processing and analog-to-digital conversion processing on the at least one initial audio signal in which the signal amplitudes of the some or all signals are reduced to obtain the multiple digital signals.

With reference to the foregoing possible implementation manners, in a third possible implementation manner, the at least one initial audio signal further includes a second initial audio signal the same as the first initial audio signal, and the performing analog amplification processing and analog-to-digital conversion processing on the at least one initial audio signal to obtain multiple digital signals includes performing analog amplification processing and analog-to-digital conversion processing on the first initial audio signal to obtain N first digital signals, and performing analog amplification processing and analog-to-digital conversion processing on the second initial audio signal to obtain N second digital signals, where the N first digital signals and the N second digital signals constitute N digital signal pairs, each digital signal pair in the N digital signal pairs includes one first digital signal and one second digital signal that correspond to a same gain value, and N is an integer greater than 1.

With reference to the foregoing possible implementation manners, in a fourth possible implementation manner, before the determining an unclipped digital signal in the multiple digital signals, the method further includes performing audio mixing processing on a first digital signal and a second digital signal that are included in a first digital signal pair to obtain a first optimized digital signal, where the N digital signal pairs include the first digital signal pair, and the determining an unclipped digital signal in the multiple digital signals includes determining an unclipped digital signal from a digital signal set that is constituted of the first optimized digital signal and another digital signal, where the other digital signal is a digital signal in the multiple digital signals except the first digital signal pair.

With reference to the foregoing possible implementation manners, in a fifth possible implementation manner, the method further includes performing volume balance processing on the output signal such that a signal amplitude of the output signal is within an interval of a human ear comfort amplitude.

Based on the foregoing technical solutions, according to the pickup apparatus and the pickup method provided in the present disclosure, one or more microphones are configured, where the one or more microphones may have high sensitivity and/or high sound overload pressure. Multiple amplifiers that have different gain values from each other are configured to perform analog amplification processing on an audio signal from a same microphone, the audio signal on which analog amplification processing is performed is converted into a digital signal, an unclipped digital signal is determined from multiple digital signals, and an output signal is determined according to a gain value corresponding to the unclipped digital signal. In this way, in a pickup scenario of a high-volume signal, the pickup apparatus may use, as an output signal, a digital signal corresponding to an amplifier that has a relatively small gain value. In a pickup scenario of a low-volume signal, the pickup apparatus may use, as an output signal, a digital signal corresponding to an amplifier that has a relatively large gain value. Therefore, in various scenarios, the output signal determined by the pickup apparatus is not clipped and has an appropriate gain value such that the pickup apparatus may be applied in various pickup scenarios, thereby enhancing user experience.

BRIEF DESCRIPTION OF DRAWINGS

To describe the technical solutions in the embodiments of the present disclosure more clearly, the following briefly describes the accompanying drawings required for describing the embodiments of the present disclosure or the prior art. The accompanying drawings in the following description show merely some embodiments of the present disclosure, and persons of ordinary skill in the art may still derive other drawings from these accompanying drawings without creative efforts.

DESCRIPTION OF EMBODIMENTS

The following clearly describes the technical solutions in the embodiments of the present disclosure with reference to the accompanying drawings in the embodiments of the present disclosure. The described embodiments are a part rather than all of the embodiments of the present disclosure. All other embodiments obtained by persons of ordinary skill in the art based on the embodiments of the present disclosure without creative efforts shall fall within the protection scope of the present disclosure.

A pickup apparatus in the embodiments of the present disclosure may be any device that has a sound pickup function, for example, a handheld terminal device such as a mobile phone, a tablet computer, or a recording pen. No limitation is set in the embodiments of the present disclosure.

Figure 1:
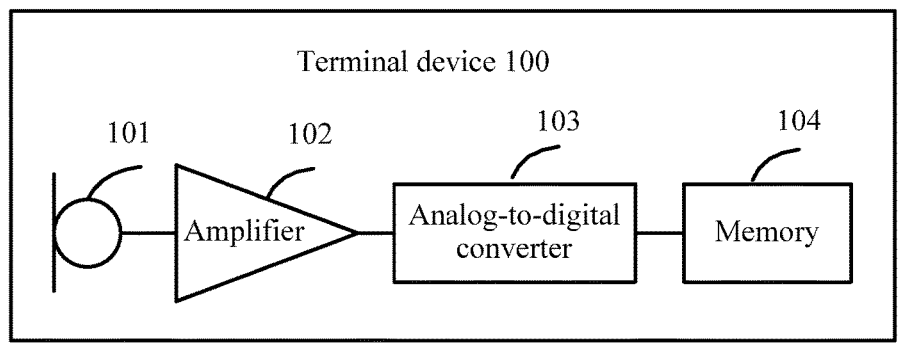
FIG. 1 is a schematic block diagram of a typical pickup apparatus.
Figure 2:
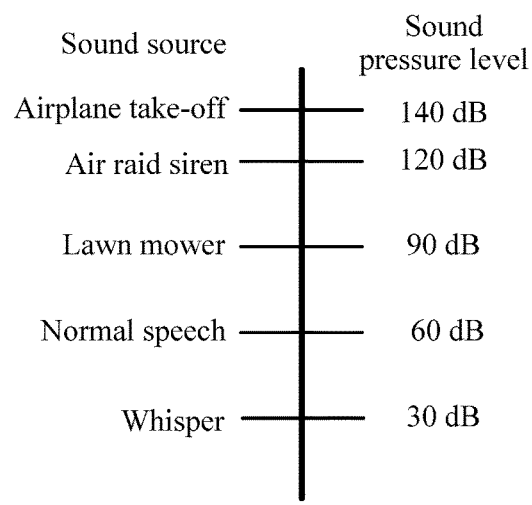
FIG. 2 is a schematic diagram of an SPL corresponding to a typical sound source scenario.
Figure 3:
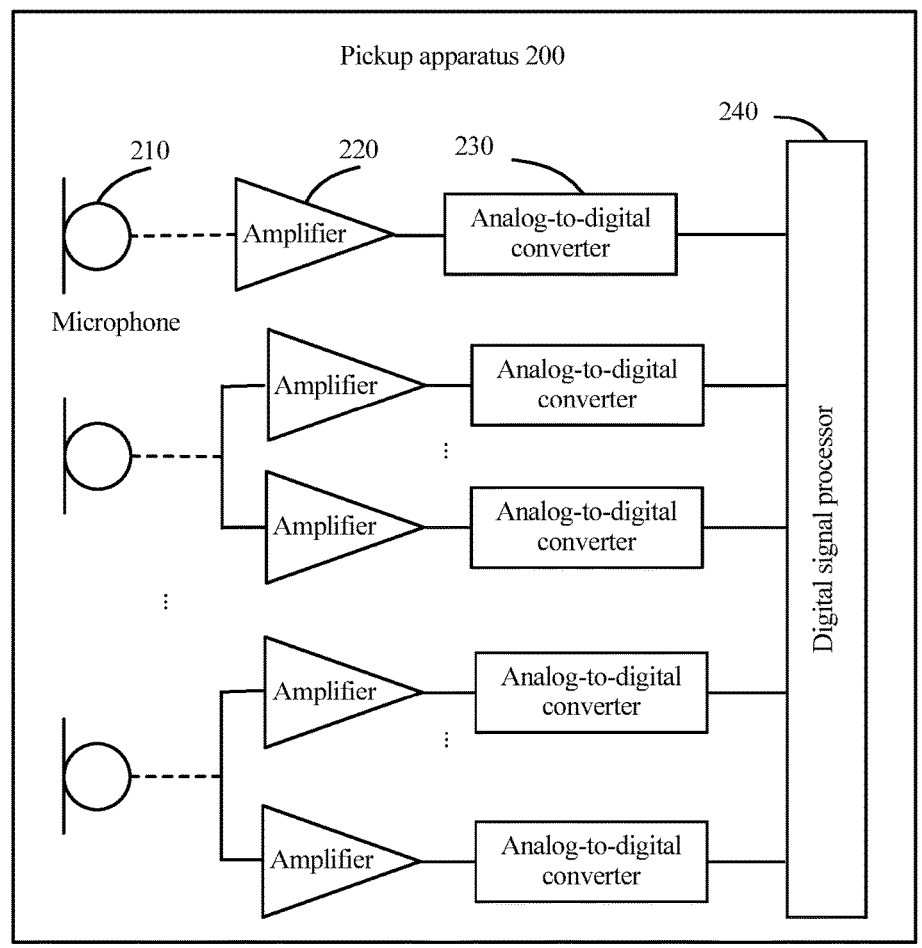
FIG. 3 is a schematic block diagram of a pickup apparatus according to an embodiment of the present disclosure.

FIG. 3 is a schematic block diagram of a pickup apparatus 200 according to an embodiment of the present disclosure. As shown in FIG. 3, the pickup apparatus 200 includes at least one microphone 210, multiple amplifiers 220, multiple analog-to-digital converters 230, and a digital signal processor (DSP) 240, where the multiple amplifiers 220 are in a one-to-one correspondence with the multiple analog-to-digital converters 230, each amplifier 220 in the multiple amplifiers 220 corresponds to one microphone 210 in the at least one microphone 210, and at least two amplifiers 220 that have different gain values from each other and that are in the multiple amplifiers 220 correspond to a same microphone 210 in the at least one microphone 210, where each microphone 210 in the at least one microphone 210 is configured to receive an audio signal, and send the audio signal to an amplifier 220 corresponding to each microphone 210, each amplifier 220 in the multiple amplifiers 220 is configured to amplify the received audio signal to obtain the amplified audio signal, and send the amplified audio signal to an analog-to-digital converter 230 corresponding to each amplifier 220, each analog-to-digital converter 230 in the multiple analog-to-digital converters 230 is configured to convert the received audio signal into a digital signal, and send the digital signal to the digital signal processor 240, and the digital signal processor 240 is configured to receive multiple digital signals sent by the multiple analog-to-digital converters 230, determine an unclipped digital signal from the multiple received digital signals, and determine an output signal according to a gain value corresponding to the unclipped digital signal.

Therefore, according to the pickup apparatus in this embodiment of the present disclosure, one or more microphones are configured, where the one or more microphones may have high sensitivity and/or high sound overload pressure. Multiple amplifiers that have different gain values from each other are configured to perform analog amplification processing on an audio signal from a same microphone, the audio signal on which analog amplification processing is performed is converted into a digital signal, an unclipped digital signal is determined from multiple digital signals, and an output signal is determined according to a gain value corresponding to the unclipped digital signal. In this way, in a pickup scenario of a high-volume signal, the pickup apparatus may use, as an output signal, a digital signal corresponding to an amplifier that has a relatively small gain value. In a pickup scenario of a low-volume signal, the pickup apparatus may use, as an output signal, a digital signal corresponding to an amplifier that has a relatively large gain value. Therefore, in various scenarios, the output signal determined by the pickup apparatus is not clipped and has an appropriate gain value such that the pickup apparatus may be applied in various pickup scenarios, thereby enhancing user experience.

In addition, compared with existing amplification processing that is performed on the audio signal in a digital signal processor using a software-based gain, the pickup apparatus in this embodiment of the present disclosure implements amplification processing for the audio signal using an amplifier that has different amplification gain values. Therefore, noise may be prevented from being amplified during a process in which the digital signal processor amplifies the audio signal, thereby increasing a signal-to-noise ratio of the audio signal.

In this embodiment of the present disclosure, the at least one 210 may include one or more microphones 210. In an embodiment, if the at least one microphone 210 includes one microphone 210, the microphone may have high sensitivity and high sound overload pressure. For example, a signal-to-noise ratio of the microphone may be 66 dB, sensitivity is −38 dB, and the sound overload pressure is 136 dB. However, this embodiment of the present disclosure sets no limitation on a type of the microphone. If the at least one 210 includes multiple microphones 210, some microphones in the multiple microphones may have high sensitivity and moderate sound overload pressure, and other microphones may have high sound overload pressure and moderate sensitivity to adapt to different pickup scenarios. Alternatively, the multiple microphones may have a same physical parameter, that is, the multiple microphones are same microphones, and all the multiple microphones have relatively high sensitivity and sound overload pressure. However, this embodiment of the present disclosure is not limited thereto.

In this embodiment of the present disclosure, each microphone 210 in the at least one microphone 210 may correspond to at least one amplifier 220 in the multiple amplifiers 220, each amplifier 220 in the multiple amplifiers 220 may correspond to one microphone 210 in the at least one microphone 210, and at least two amplifiers 220 that have different gain values from each other and that are in the multiple amplifiers 220 correspond to a same microphone 210 in the at least one microphone 210, where any two amplifiers in the at least two amplifiers have different gain values. In an embodiment, if the at least one 210 includes one microphone 210, the multiple amplifiers 220 may correspond to the only one microphone. If the at least one 210 includes multiple microphones 210, at least two amplifiers in the multiple amplifiers 220 may correspond to a same microphone, and another amplifier except the at least two amplifiers may correspond to another microphone except the same microphone. However, this embodiment of the present disclosure is not limited thereto.

In this embodiment of the present disclosure, the at least two amplifiers that correspond to the same microphone 210 and that are in the multiple amplifiers 220 have different gain values from each other. For easy of description, the at least two amplifiers may be sorted in descending order of gain values. In an embodiment, a difference between gain values of any two neighboring amplifiers in the at least two sorted amplifiers may be a fixed value, for example, 30 dB, that is, the gain values of the at least two amplifiers constitute an arithmetic sequence. For example, the at least two amplifiers are three amplifiers whose gain values are respectively −30 dB, 0 dB, and 30 dB. However, this embodiment of the present disclosure is not limited thereto. In an embodiment, the at least two amplifiers may include an amplifier whose gain value is a negative value or zero, and if the multiple amplifiers include another amplifier except the at least two amplifiers, a gain value of the other amplifier may be equal to a gain value of one amplifier in the at least two amplifiers. However, this embodiment of the present disclosure is not limited thereto.

The multiple analog-to-digital converters 230 are in a one-to-one correspondence with the multiple amplifiers 220, and each analog-to-digital converter 230 is configured to receive an audio signal sent by an amplifier 220 corresponding to the analog-to-digital converter 230, and convert the received audio signal into a digital signal. Each analog-to-digital converter 230 and the amplifier 220 corresponding to the analog-to-digital converter 230 constitute an analog channel, which is configured to perform amplification processing and analog-to-digital conversion processing on the received audio signal to obtain the digital signal. A digital signal obtained by each analog channel is transmitted to the digital signal processor 240.

The digital signal processor 240 is configured to receive a digital signal sent by each analog-to-digital converter 230 in the multiple analog-to-digital converters 230, that is, receive the multiple digital signals, and determine the output signal of the digital signal processor 240 according to the multiple received digital signals. In an embodiment, the digital signal processor 240 may first determine one or more unclipped digital signals according to the multiple received digital signals. In an embodiment, the digital signal processor 240 may first process some or all digital signals in the multiple digital signals, for example, audio mixing, noise reduction, volume balance, phase synchronization, and amplitude normalization, and then selects one or more unclipped digital signals from the multiple digital signals obtained by means of processing. Alternatively, the digital signal processor 240 may not process the multiple received digital signals, but directly selects one or more unclipped digital signals from the multiple received digital signals. No limitation is set in this embodiment of the present disclosure. Then, the digital signal processor 220 may select, as the output signal, a digital signal from the one or more unclipped digital signals according to gain values corresponding to the one or more determined unclipped digital signals. However, this embodiment of the present disclosure is not limited thereto.

In this embodiment of the present disclosure, the digital signal processor 240 may determine, using multiple methods, whether a digital signal is clipped. In an embodiment, the digital signal processor 240 may determine, by extracting one or more characteristic parameters in a digital signal, whether the digital signal is clipped, for example, by extracting at least one of the following characteristic parameters: a sampled point value of the digital signal, probability distribution of the sampled point value, stable duration of the sampled point value, and an envelope shape of a sampled point peak value. However, this embodiment of the present disclosure is not limited thereto.

In an embodiment, the digital signal processor 240 is configured to determine, as an output signal, a digital signal that corresponds to a maximum gain value and that is in the unclipped digital signal.

Any microphone 210 in the at least one microphone 210 is used as an example. The pickup method according to this embodiment of the present disclosure is as follows The microphone 210 converts a received sound signal into an analog electrical signal, and sends the analog electrical signal to at least one amplifier 220 corresponding to the microphone 210, after the analog electrical signal is transmitted to the at least one amplifier 220 corresponding to the microphone 210, each amplifier 220 in the at least one amplifier 220 performs analog amplification processing on the analog electrical signal according to a preset gain value to change a signal amplitude of the analog electrical signal, and sends, to an analog-to-digital converter 230 corresponding to the amplifier 220, the analog electrical signal on which analog amplification processing is performed, when the analog electrical signal on which analog amplification processing is performed is transmitted to the analog-to-digital converter 230, the analog-to-digital converter 230 converts the received analog electrical signal into a digital signal, and sends the digital signal to the digital signal processor 240, finally, the digital signal processor 240 receives the digital signal corresponding to the microphone 210 and a digital signal corresponding to another microphone 210, and determines one or more unclipped digital signal according to the multiple received digital signals. If there is only one unclipped digital signal, the digital signal processor 240 may directly use the unclipped digital signal as the output signal. If there are multiple unclipped digital signals, the digital signal processor 240 may select, as an output signal, a digital signal that has a maximum gain value and that is in the multiple unclipped digital signals. However, this embodiment of the present disclosure is not limited thereto.

It should be understood that, in this embodiment of the present disclosure, a "clipped" audio signal refers to an audio signal whose waveform is saturated. In an embodiment, a clipped analog signal refers to an analog signal whose waveform is directly saturated, and a clipped digital signal refers to a digital signal whose sampled point value is saturated. However, this embodiment of the present disclosure is not limited thereto. In addition, both the amplifier and the analog-to-digital converter may perform clipping. Therefore, a possible reason why the "clipped digital signal" exists is that the amplifier performs clipping on the analog electrical signal, or the analog-to-digital converter performs clipping on the digital signal, or both. No limitation is set in this embodiment of the present disclosure.

In this embodiment of the present disclosure, when both sound overload pressure and sensitivity of a microphone 210 in the at least one microphone 210 are relatively high, a signal amplitude of an audio signal sent by the microphone 210 may be relatively large, and the audio signal whose signal amplitude is relatively large may be clipped because maximum sound pressure supported by an amplifier 220 and/or an analog-to-digital converter 230 corresponding to the microphone 210 is exceeded. For example, voltage drain drain (VDD) of a general amplifier and analog-to-digital converter is approximately 1.8 voltage (V). It is assumed that sound overload pressure of the microphone is 136 dB of SPL, and sensitivity is −42 dB, it can be learned, according to the following calculation formula (1) of the sensitivity, that a voltage of the audio signal is approximately 7.94 millivolts (mV) after an input signal of a SPL of 94 dB passes through the microphone.

$$S(\text{dB}) = 20 \times \log_{10}\left(\frac{S(\text{mV/Pa})}{1000(\text{mV/Pa})}\right), \quad (1)$$

S represents sensitivity. In consideration of a linear law of the microphone at an operating region, it can be learned that a voltage of an audio signal output by the microphone is approximately 999.6 mV in a case that a SPL of the input signal is a maximum SPL 136 dB supported by the microphone. A voltage peak corresponding to the valid voltage value is approximately 2.8 mV, which apparently exceeds the voltage drain drain of the general amplifier and analog-to-digital converter. In this case, to avoid clipping of the audio signal by the amplifier and/or the analog-to-digital converter, a signal processing unit may be disposed in front of the amplifier to process the audio signal such that the audio signal is within the voltage drain drain of the amplifier and analog-to-digital converter.

Figure 4:
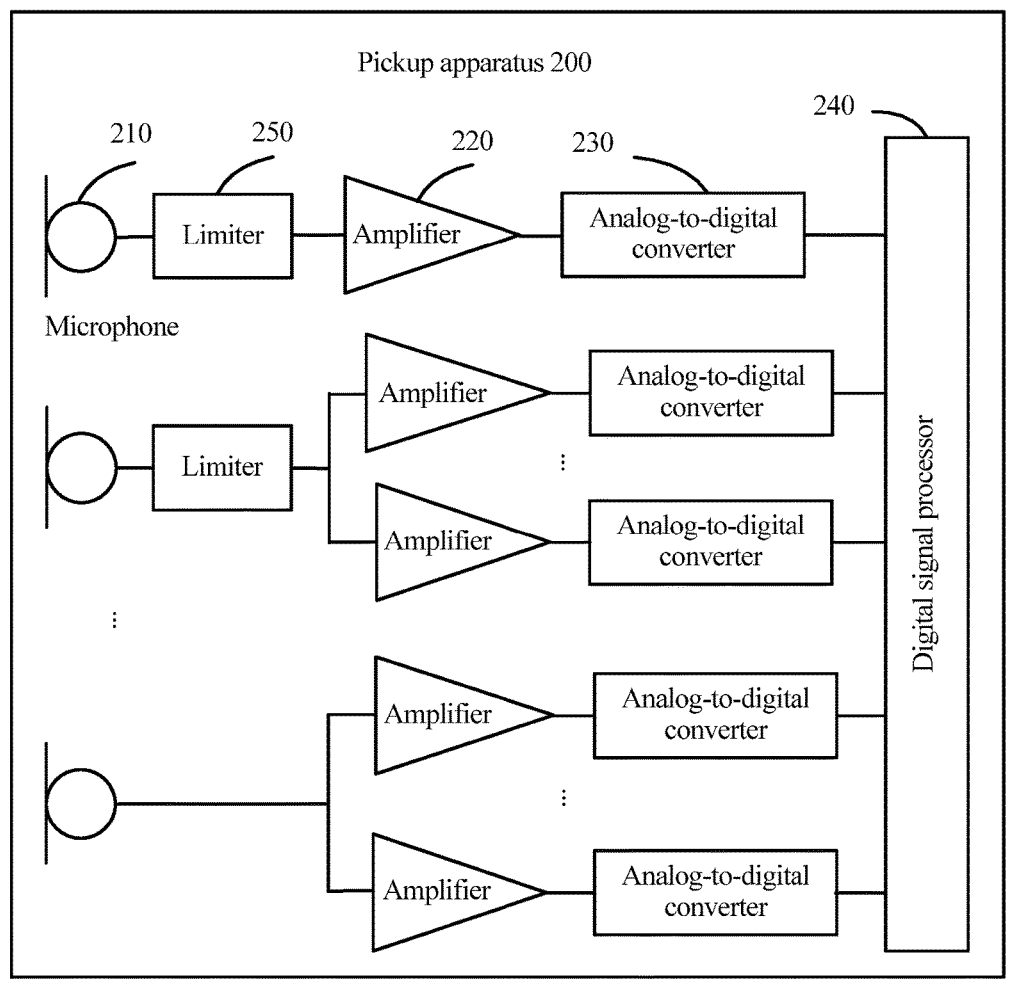
FIG. 4 is another schematic block diagram of a pickup apparatus according to an embodiment of the present disclosure.

In an embodiment, as shown in FIG. 4, the apparatus 200 further includes a limiter 250, where two ends of the limiter 250 are respectively connected to at least one amplifier 220 in the multiple amplifiers 220 and a microphone 210 respectively corresponding to the at least one amplifier 220, and the limiter 250 is configured to receive an audio signal sent by a microphone 210 connected to the limiter 250, reduce a signal amplitude of the received audio signal, and send, to an amplifier 220 connected to the limiter 250, the audio signal whose signal amplitude is reduced, and correspondingly, the at least one amplifier 220 is configured to receive the audio signal whose signal amplitude is reduced and that is sent by the limiter 250 respectively connected to the at least one amplifier 220.

In an embodiment, the pickup apparatus 200 may include one or more limiters 250. Each limiter 250 may be disposed between an amplifier 220 and a microphone 210 corresponding to the amplifier 220, and is configured to reduce an amplitude of the received audio signal sent by the microphone 210, and send, to the amplifier 210, the audio signal whose amplitude is reduced. In this way, even though the signal amplitude of the audio signal sent by the microphone 210 is relatively large, after amplitude reduction processing is performed by the limiter 250, the signal amplitude of the audio signal may not exceed maximum sound pressure supported by the amplifier and/or the analog-to-digital converter to avoid clipping of the audio signal by the amplifier and/or the analog-to-digital converter. In an embodiment, the limiter 250 may be implemented using an operational amplifier whose gain value is a negative value. However, this embodiment of the present disclosure sets no limitation thereto.

Figure 5:
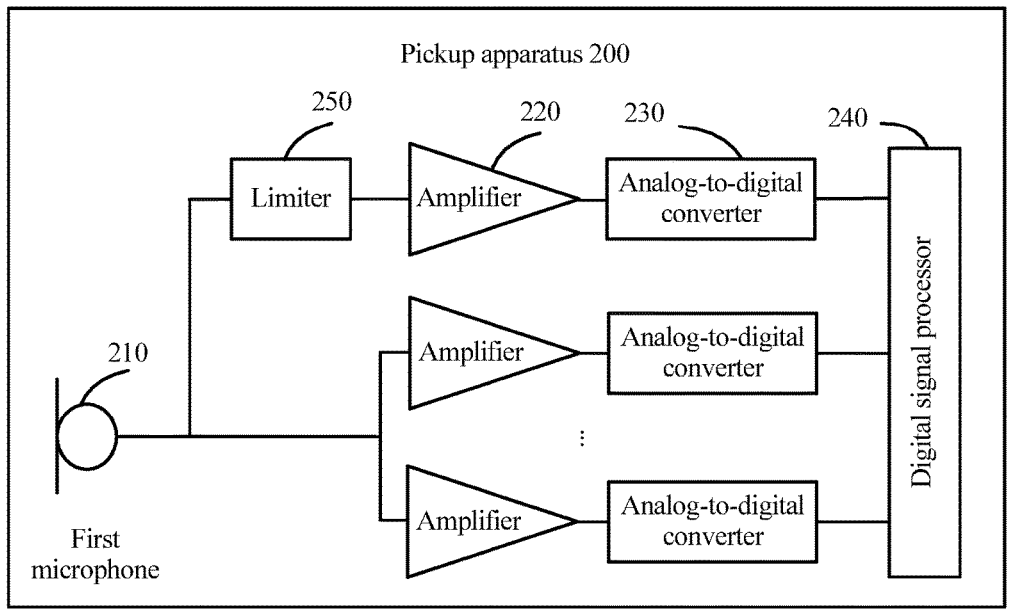
FIG. 5 is a schematic block diagram of an example of a pickup apparatus according to an embodiment of the present disclosure.

As shown in FIG. 5, the at least one microphone 210 is a first microphone, where the first microphone has high sensitivity and high sound overload pressure. In this case, that two ends of the limiter are respectively connected to at least one amplifier in the multiple amplifiers and a microphone respectively corresponding to the at least one amplifier includes the two ends of the limiter 250 are respectively connected to the first microphone 210 and a first amplifier 220 corresponding to the first microphone 210, where the multiple amplifiers 220 include the first amplifier 220, and correspondingly, that at least two amplifiers that have different gain values from each other and that are in the multiple amplifiers correspond to a same microphone in the at least one microphone includes the first microphone 210 is directly connected to at least another two amplifiers in the multiple amplifiers 220 except the first amplifier 220, where any two amplifiers 220 in the at least another two amplifiers 220 have different gain values.

The at least another two amplifiers 220 have different gain values from each other. In an embodiment, a gain value of the first amplifier may be different from a gain value of any amplifier in the at least another two amplifiers, or may be the same as a gain value of an amplifier in the at least another two amplifiers. No limitation is set in this embodiment of the present disclosure.

In this case, in a pickup scenario of high volume, because the first amplifier connected to the limiter may not perform clipping on the audio signal, the output signal determined by the digital signal processor 220 may be from the first amplifier. In a pickup scenario of low volume, the output signal may be from an amplifier that has a maximum gain value and that is in the at least another two amplifiers that have different gain values from each other. In a pickup scenario of medium volume, the output signal may be an amplifier that has a medium or relatively small gain value and that is in the at least another two amplifiers that have different gain values from each other. However, this embodiment of the present disclosure is not limited thereto.

Figure 6:
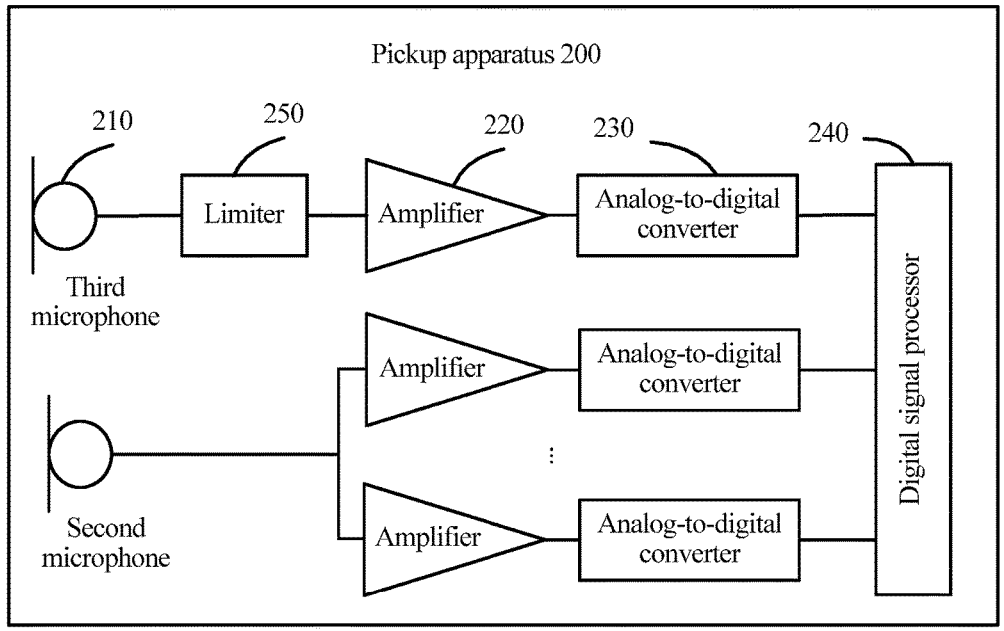
FIG. 6 is a schematic block diagram of another example of a pickup apparatus according to an embodiment of the present disclosure.

As shown in FIG. 6, the at least one microphone 210 includes a second microphone and a third microphone, where the second microphone has high sensitivity, and the third microphone has high sound overload pressure, and correspondingly, that at least two amplifiers that have different gain values from each other and that are in the multiple amplifiers correspond to a same microphone in the at least one microphone includes the at least two amplifiers that have different gain values from each other and that are in the multiple amplifiers correspond to the second microphone.

The third microphone may correspond to one or more amplifiers in the multiple amplifiers 220, and the at least two amplifiers that have different gain values from each other may be another amplifier in the multiple amplifiers 220 except the one or more amplifiers corresponding to the third microphone. However, this embodiment of the present disclosure is not limited thereto. In this case, because the second microphone has high sensitivity, the second microphone may be mainly applied in pickup scenarios of low volume and medium volume. The third microphone has high sound overload pressure and may be mainly applied in a pickup scenario of high volume. In an embodiment, to avoid a clipping phenomenon in the pickup scenario of high volume, the limiter 250 may be disposed in front of an amplifier corresponding to the third microphone to reduce a signal amplitude of an audio signal inputted into the amplifier corresponding to the third microphone. However, this embodiment of the present disclosure is not limited thereto.

In the pickup scenarios of low volume and medium volume, the output signal determined by the digital signal processor 240 may be from the second microphone, and in a case of different signal amplitudes, the output signal may be from different amplifiers corresponding to the second microphone. In the pickup scenario of high volume, the output signal determined by the digital signal processor 240 may be from the third microphone. However, this embodiment of the present disclosure is not limited thereto.

Figure 7:
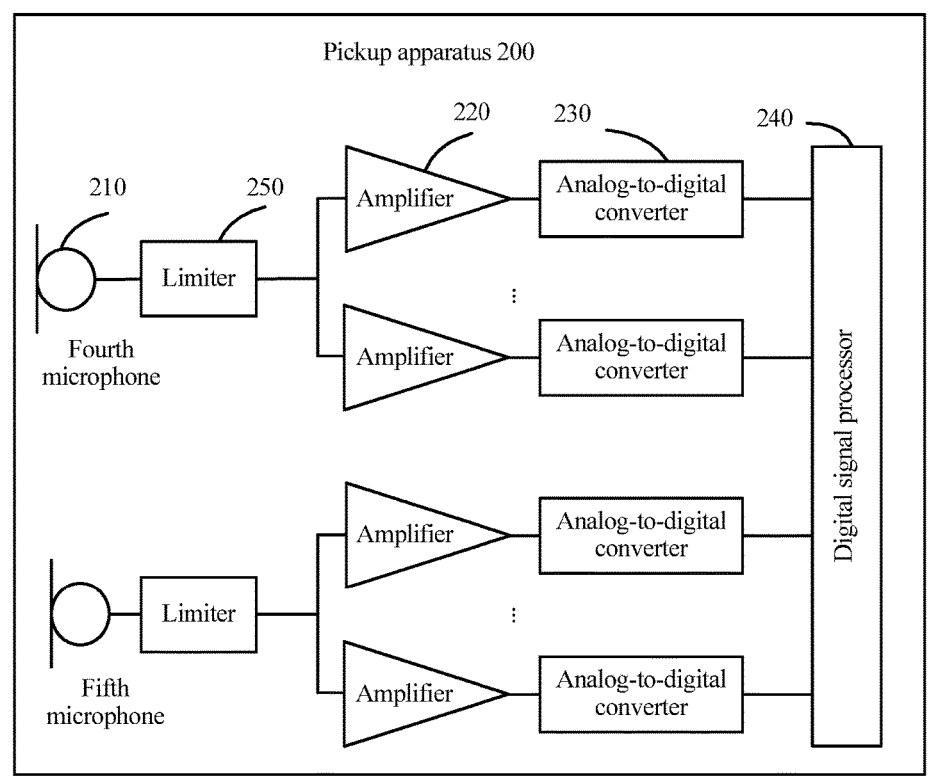
FIG. 7 is a schematic block diagram of still another example of a pickup apparatus according to an embodiment of the present disclosure.

As shown in FIG. 7, the at least one microphone 210 includes a fourth microphone 210 and a fifth microphone 210, where the fourth microphone and the fifth microphone have a same physical parameter, and correspondingly, that at least two amplifiers that have different gain values from each other and that are in the multiple amplifiers correspond to a same microphone in the at least one microphone includes N second amplifiers 220 that have different gain values from each other and that are in the multiple amplifiers 220 correspond to the fourth microphone 210, and N third amplifiers 220 that have different gain values from each other and that are in the multiple amplifiers 220 correspond to the fifth microphone 210, where the N second amplifiers and the N third amplifiers constitute N amplifier pairs, each amplifier pair in the N amplifier pairs includes one second amplifier and one third amplifier that have a same gain value, and N is an integer greater than 1.

The fourth microphone and the fifth microphone may be a same microphone and respectively corresponding to N amplifiers that have different gain values from each other and that are in the multiple amplifiers 220, where N≤M/2, and M is a quantity of the multiple amplifiers. Gain values of the N second amplifiers are in a one-to-one correspondence with, and equal to those of the N third amplifiers. That is, if the N second amplifiers and the N third amplifiers are sorted according to the gain values, a gain value of the $i^{th}$ second amplifier in the N sorted second amplifiers is equal to a gain value of the $i^{th}$ third amplifier in the N sorted third amplifiers. In this case, the $i^{th}$ second amplifier and the $i^{th}$ third amplifier constitute an amplifier pair, where 1≤i≤N. In an embodiment, the limiter 250 may further be disposed in front of at least one amplifier in the N second amplifiers and/or the N third amplifiers. However, this embodiment of the present disclosure is not limited thereto.

In this case, in different pickup scenarios, the output signal determined by the digital signal processor 240 may be from different amplifiers and/or microphones. In an embodiment, in a pickup scenario in which the input signal is constantly of low volume, the output signal determined by the digital signal processor 240 may be from an amplifier that has a relatively large gain value and that is in the N second amplifiers and/or the N third amplifiers. In a pickup scenario in which the input signal is constantly of high volume, the output signal may be from an amplifier that has a relatively small gain value and that is in the N second amplifiers and/or the N third amplifiers, or from an amplifier in front of which the limiter is disposed and that is in the N second amplifiers and/or the N third amplifiers. However, this embodiment of the present disclosure is not limited thereto.

In a case that the foregoing pickup apparatus 200 has two same microphones and N amplifier pairs, to further increase a signal-to-noise ratio of the audio signal, audio mixing processing may be performed on two digital signals output by each amplifier pair in at least one amplifier pair. Correspondingly, the digital signal processor 240 is configured to perform audio mixing on a first digital signal pair in the multiple received digital signals to obtain an optimized digital signal, where the first digital signal pair is constituted of digital signals respectively corresponding to a second amplifier and a third amplifier that are included in a first amplifier pair, and the N amplifier pairs include the first amplifier pair, and determine an unclipped digital signal from a digital signal set that is constituted of the optimized digital signal and another digital signal, where the other digital signal is a digital signal in the multiple digital signals except the first digital signal pair.

For ease of description, a digital signal sent by an analog-to-digital converter respectively corresponding to the N second amplifiers is referred to as a first digital signal in the following, and a digital signal sent by an analog-to-digital converter respectively corresponding to the N third amplifiers is referred to as a second digital signal, which constitute a digital signal pair together with a first digital signal that is sent by an analog-to-digital converter corresponding to a second amplifier in an amplifier pair and a second digital signal that is sent by an analog-to-digital converter corresponding to a third amplifier in the amplifier pair. The digital signal processor 240 may perform audio mixing processing on one or more digital signal pairs in the N digital signal pairs. If the digital signal processor 240 performs audio mixing processing on multiple digital signal pairs, the digital signal processor 240 may perform audio mixing processing on a first digital signal and a second digital signal that are included in each digital signal pair in the multiple digital signal pairs to obtain multiple optimized digital signals. However, this embodiment of the present disclosure is not limited thereto.

In this case, to ensure maximum consistency between audio signals received by the fourth microphone and the fifth microphone, sound entry holes of the fourth microphone and the fifth microphone may be disposed possibly close to each other provided that no mutual interference is generated. However, this embodiment of the present disclosure is not limited thereto.

The digital signal processor 240 may selectively perform audio mixing processing on some digital signal pairs in the N digital signal pairs, for example, a digital signal pair corresponding to a maximum gain value and/or a digital signal pair processed by the limiter 250. The digital signal processor 240 may also perform audio mixing processing on all digital signal pairs in the N digital signal pairs. However, this embodiment of the present disclosure is not limited thereto. If the digital signal processor 240 performs audio mixing processing on L digital signal pairs in the N digital signal pairs, and 1≤L<N, the digital signal processor 240 may select an unclipped digital signal from L optimized digital signals obtained after audio mixing processing is performed or from 2×(N−L) digital signals of another (N−L) amplifier pairs. However, this embodiment of the present disclosure is not limited thereto.

In this way, after audio mixing processing is performed, an optimized digital signal with a relatively high signal-to-noise ratio may be obtained, thereby further improving pickup performance and user experience that are of the pickup apparatus.

After determining the output signal, the digital signal processor 240 may further perform volume balance processing on the output signal to further improve the user experience. Correspondingly, the digital signal processor 240 is further configured to perform volume balance processing on the output signal such that a signal amplitude of the output signal is within an interval of a human ear comfort amplitude.

The volume balance processing may be implemented in a target level manner in a conventional level adjustment algorithm, and the interval of the human ear comfort amplitude may be a signal amplitude interval at which it is comfortable for a user to sound. However, this embodiment of the present disclosure is not limited thereto. In an embodiment, if a signal amplitude of the output signal is greater than the interval of the human ear comfort amplitude, the digital signal processor 240 may reduce the signal amplitude of the output signal. If a signal amplitude of the output signal is less than the interval of the human ear comfort amplitude, the digital signal processor 220 may enlarge the signal amplitude of the output signal. If a signal amplitude of the output signal is within the interval of the human ear comfort amplitude, the digital signal processor 240 may not perform the foregoing volume balance processing, but directly outputs the output signal such that a signal amplitude of an eventually output digital signal is always within the interval of the human ear comfort amplitude, thereby improving the user experience. However, this embodiment of the present disclosure is not limited thereto.

The digital signal processor 240 is further configured to perform phase synchronization processing on the currently determined output signal if an amplifier corresponding to the currently determined output signal is different from an amplifier corresponding to a previously output digital signal to ensure smooth transition from a phase of the previously output digital signal to a phase of the currently determined output signal.

In an embodiment, if two determined output signals are respectively corresponding to different amplifiers, that is, digital signals are obtained after processed by two different analog channels, the digital signal processor 240 may perform phase synchronization processing on a current output signal to ensure smooth transition from a phase of the previously output digital signal to a phase of the output signal and ensure that two audio signals picked up by the pickup apparatus are continuous, thereby further improving the user experience. If the two determined output signals are from a same microphone, the digital signal processor 240 may further perform amplitude normalization processing on the currently determined output signal such that an amplitude of the output signal keeps consistent with an amplitude of the previously output digital signal. However, this embodiment of the present disclosure is not limited thereto.

The pickup apparatus 200 may further include a detection unit configured to detect whether at least one microphone 210 included in the pickup apparatus 200 is in an in-position state. Correspondingly, a microphone 210 that is in an in-position state and that is in the at least one microphone 210 receives the audio signal. In an embodiment, a possible reason why the microphone is not in an in-position state is a hardware failure or physical congestion. No limitation is set in this embodiment of the present disclosure.

Therefore, according to the pickup apparatus in this embodiment of the present disclosure, one or more microphones are configured, where the one or more microphones may have high sensitivity and/or high sound overload pressure. Multiple amplifiers that have different gain values from each other are configured to perform analog amplification processing on an audio signal from a same microphone, the audio signal on which analog amplification processing is performed is converted into a digital signal, an unclipped digital signal is determined from multiple digital signals, and an output signal is determined according to a gain value corresponding to the unclipped digital signal. In this way, in a pickup scenario of a high-volume signal, the pickup apparatus may use, as an output signal, a digital signal corresponding to an amplifier that has a relatively small gain value. In a pickup scenario of a low-volume signal, the pickup apparatus may use, as an output signal, a digital signal corresponding to an amplifier that has a relatively large gain value. Therefore, in various scenarios, the output signal determined by the pickup apparatus is not clipped and has an appropriate gain value such that the pickup apparatus may be applied in various pickup scenarios, thereby enhancing user experience.

Figure 8:
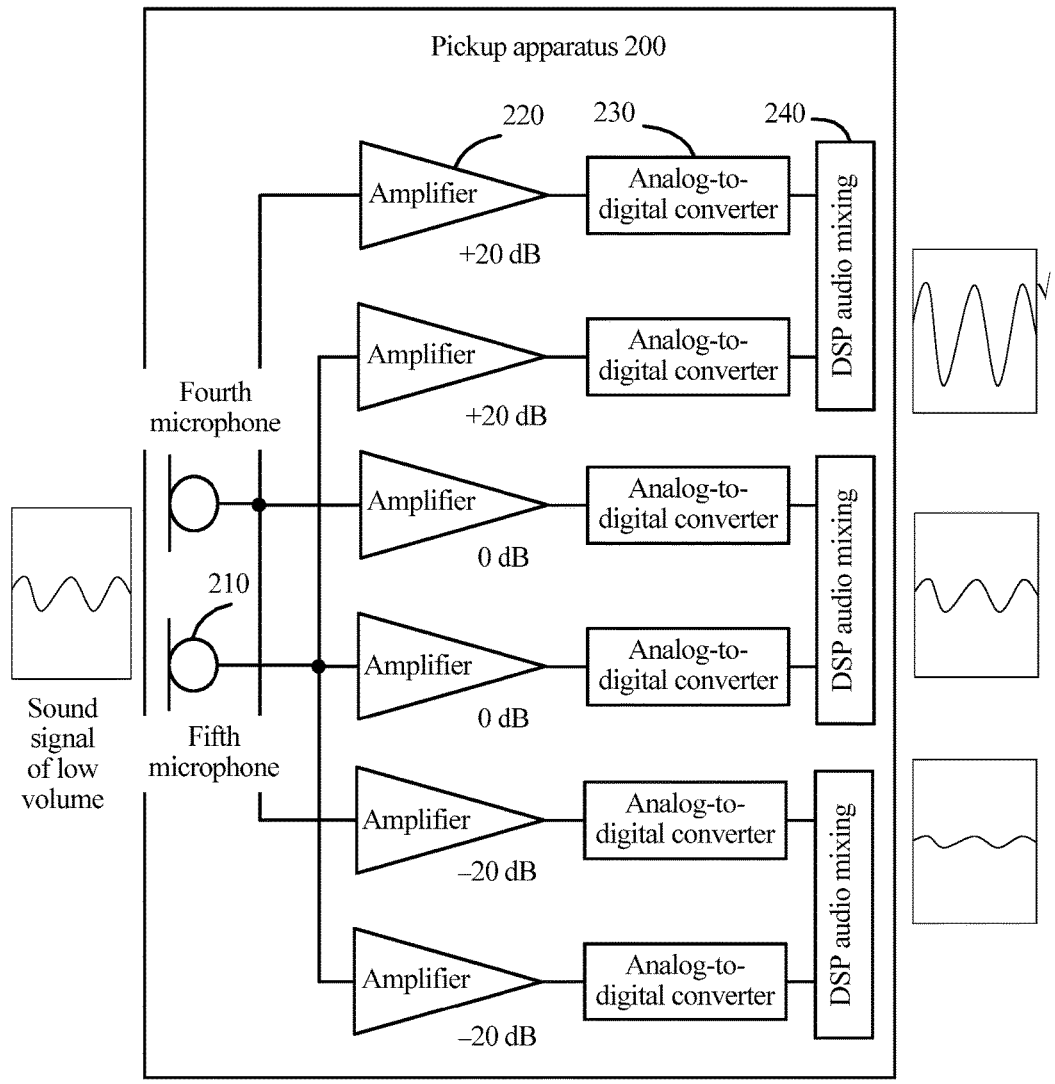
FIG. 8 is an example in which a pickup apparatus according to an embodiment of the present disclosure is applied in a pickup scenario of low volume.
Figure 9:
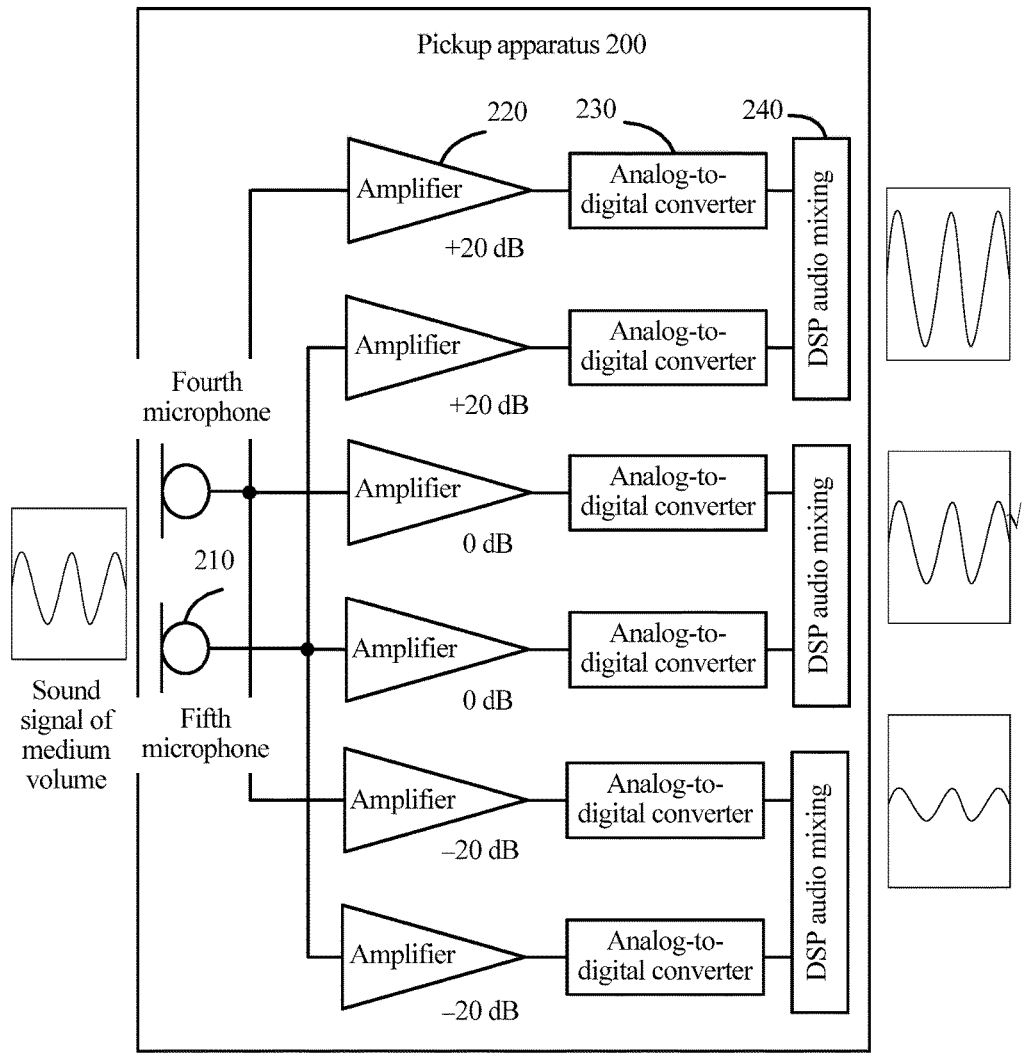
FIG. 9 is an example in which a pickup apparatus according to an embodiment of the present disclosure is applied in a pickup scenario of medium volume.
Figure 10:
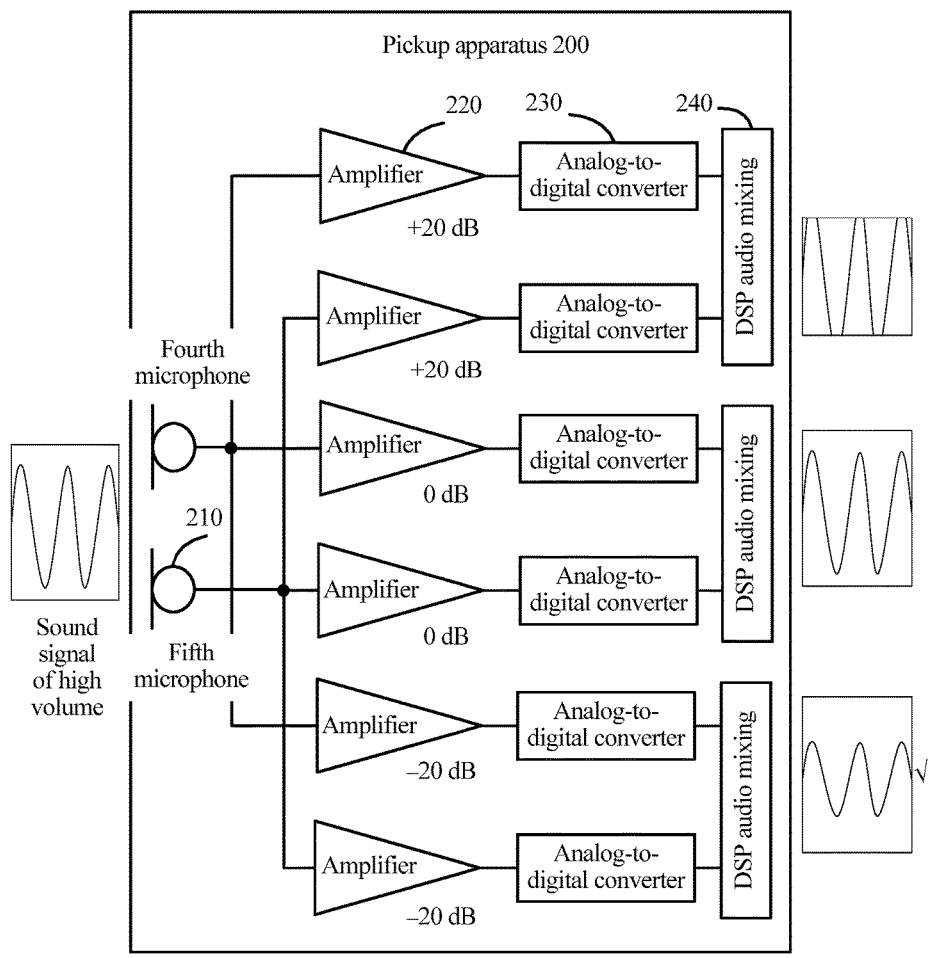
FIG. 10 is an example in which a pickup apparatus according to an embodiment of the present disclosure is applied in a pickup scenario of high volume.

FIG. 8, FIG. 9 and FIG. 10 show examples in which a pickup apparatus 200 according to an embodiment of the present disclosure is applied in various pickup scenarios. Configuration of the pickup apparatus 200 is similar to that of the pickup apparatus 200 shown in FIG. 7. In an embodiment, the pickup apparatus 200 includes two same microphones 210, a fourth microphone, and a fifth microphone, and each microphone 210 corresponds to three amplifiers 220 whose gain values are respectively 20 dB, 0 dB, and −20 dB. Three amplifiers corresponding to the fourth microphone and three amplifiers corresponding to the fifth microphone constitute three amplifier pairs, and each amplifier pair includes two amplifiers that have a same gain value. A DSP performs audio mixing processing on digital signals corresponding to the three amplifiers to obtain three optimized digital signals, and selects one optimized digital signal from the three optimized digital signals as an output signal. To facilitate understanding, three DSPs are shown in FIG. 8, FIG. 9 and FIG. 10. However, in actual implementation, there may be one DSP, that is, one DSP implements audio mixing processing on the three digital signals. No limitation is set in this embodiment of the present disclosure.

As shown in FIG. 8, in a pickup scenario of low volume, signal amplitudes of audio signals received by the fourth microphone and the fifth microphone are relatively low, the multiple amplifiers and an analog-to-digital converter do not perform clipping on the audio signal. In this case, the DSP may select, from the three optimized digital signals and as an output signal, an optimized digital signal corresponding to a maximum gain value (+20 dB).

As shown in FIG. 9, in a pickup scenario of medium volume, signal amplitudes of audio signals received by the fourth microphone and the fifth microphone are at a medium level. In this case, the DSP may select, from the three optimized digital signals and as an output signal, an optimized digital signal corresponding to a medium gain value (0 dB).

As shown in FIG. 10, in a pickup scenario of high volume, signal amplitudes of audio signals received by the fourth microphone and the fifth microphone are relatively large, and both two amplifiers whose gain values are +20 dB perform clipping on the received audio signal. In this case, the DSP may select, from the three optimized digital signals and as an output signal, an optimized digital signal corresponding to a minimum gain value (−20 dB).

In addition, it should be understood that the pickup apparatus shown in FIG. 3 to FIG. 10 and an application of the pickup apparatus are used only for exemplary description, but not intend to limit the scope of this embodiment of the present disclosure. Persons skilled in the art certainly can make various modifications or changes according to examples provided in FIG. 3 to FIG. 10, and such modifications or changes also fall within the protection scope of this embodiment of the present disclosure.

Figure 11:
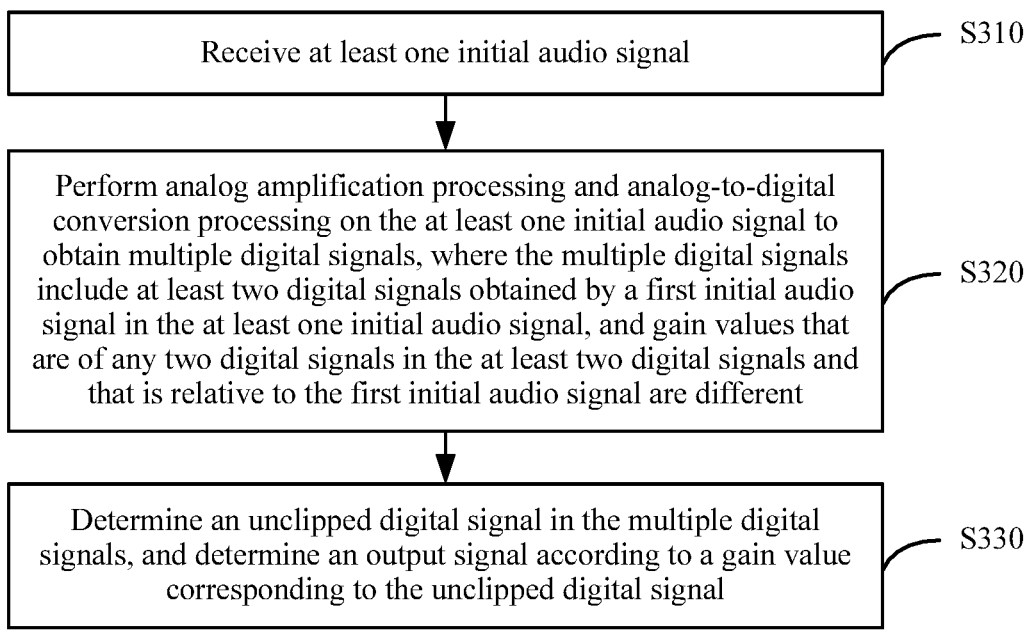
FIG. 11 is a schematic flowchart of a pickup method according to an embodiment of the present disclosure.

A pickup apparatus according to embodiments of the present disclosure is described in details above with reference to FIG. 3 to FIG. 10, and the following describes a pickup method according to the embodiments of the present disclosure in details with reference to FIG. 11.

FIG. 11 shows a schematic flowchart of a pickup method 300 according to an embodiment of the present disclosure. The method may be executed by a pickup apparatus 200. However, this embodiment of the present disclosure is not limited thereto. As shown in FIG. 11, the method 300 includes the following steps.

S310. Receive at least one initial audio signal.

S320. Perform analog amplification processing and analog-to-digital conversion processing on the at least one initial audio signal to obtain multiple digital signals, where the multiple digital signals include at least two digital signals obtained by a first initial audio signal in the at least one initial audio signal, and gain values that are of any two digital signals in the at least two digital signals and that are relative to the first initial audio signal are different.

S330. Determine an unclipped digital signal in the multiple digital signals, and determine an output signal according to a gain value corresponding to the unclipped digital signal.

Therefore, according to the pickup method in this embodiment of the present disclosure, at least one initial audio signal is received using at least one microphone, and multiple amplifiers that have different gain values are configured to perform analog amplification processing on an audio signal from a same microphone, the audio signal on which analog amplification processing is performed is converted into a digital signal, an unclipped digital signal is determined from multiple digital signals, and an output signal is determined according to a gain value corresponding to the unclipped digital signal. In this way, in a scenario of a high-volume signal, the pickup apparatus may select, as an output signal, a digital signal corresponding to an amplifier that has a relatively small gain value. In a scenario of a low-volume signal, the pickup apparatus may select, as an output signal, a digital signal corresponding to an amplifier that has a relatively large gain value. Therefore, in various scenarios, the audio signal picked up in the method is not clipped and has an appropriate gain value such that the pickup method may be applied in various pickup scenarios, thereby enhancing user experience.

In this embodiment of the present disclosure, S310 may be executed by at least one microphone 210 of the pickup apparatus 200, where the at least one microphone may have a same or different physical parameters. S320 may be the following two steps: performing analog amplification processing on the at least one initial audio signal to obtain multiple amplified audio signals, where the multiple amplified audio signals include at least two amplified audio signals obtained by a first initial audio signal in the at least one initial audio signal, and gain values that are of any two amplified audio signals in the at least two amplified audio signals and relative to the first initial audio signal are different, and performing analog-to-digital conversion processing on each amplified audio signal in the multiple amplified audio signals to obtain the multiple digital signals.

In an embodiment, two steps in the foregoing S320 may be executed respectively by multiple amplifiers 220 and multiple analog-to-digital converters 230, and S330 may be executed by a digital signal processor 240. However, this embodiment of the present disclosure is not limited thereto.

In an embodiment, in S320, analog amplification processing may be performed on each initial audio signal in the at least one initial audio signal using one or more amplifiers to obtain one or more amplified audio signals corresponding to the initial audio signal. At least two amplifiers that have different gain values from each other perform analog amplification processing on the first initial audio signal in the at least one initial audio signal, as so to obtain at least two amplified audio signals that have different gain values relative to the first initial audio signal. In an embodiment, gain values of the multiple amplifiers may be a positive value, zero, or a negative value, which corresponds to that a signal amplitude of an initial audio signal is increased, not changed, or decreased. However, this embodiment of the present disclosure is not limited thereto. In addition, in S320, each amplified audio signal that is in the multiple amplified audio signals and that is obtained after analog amplification processing is performed may be converted into a digital signal using an analog-to-digital converter.

In an embodiment, the determining an unclipped digital signal in the multiple digital signals, and determining an output signal according to a gain value corresponding to the unclipped digital signal in S330 includes determining, as an output signal, a digital signal that corresponds to a maximum gain value and that is in the unclipped digital signal.

Before S320, the method 300 further includes reducing signal amplitudes of some or all initial audio signals in the at least one initial audio signal.

Correspondingly, the performing analog amplification processing and analog-to-digital conversion processing on the at least one initial audio signal in S230 includes performing analog amplification processing and analog-to-digital conversion processing on the at least one initial audio signal in which the signal amplitudes of the some or all signals are reduced to obtain the multiple digital signals.

For example, a quantity of the at least one initial audio signal is M, where M≥1. In addition, in the method 300, amplitude reduction processing is performed on P initial audio signals in the M initial audio signals, where 1≤P≤M, and S320 may be performing analog amplification processing and subsequent analog-to-digital conversion processing on the P initial audio signals whose signal amplitudes are reduced and (M−P) initial audio signals. No limitation is set in this embodiment of the present disclosure.

The at least one initial audio signal further includes a second initial audio signal the same as the first initial audio signal.

Correspondingly, the performing analog amplification processing and analog-to-digital conversion processing on the at least one initial audio signal to obtain multiple digital signals in S320 includes performing analog amplification processing and analog-to-digital conversion processing on the first initial audio signal to obtain N first digital signals, and performing analog amplification processing and analog-to-digital conversion processing on the second initial audio signal to obtain N second digital signals, where the N first digital signals and the N second digital signals constitute N digital signal pairs, each digital signal pair in the N digital signal pairs includes one first digital signal and one second digital signal that have a same gain value, and N is an integer greater than 1.

In an embodiment, in S320, analog amplification processing may be performed on the first initial audio signal using N second amplifiers that have different gain values from each other to obtain N first amplified audio signals. Then, N analog-to-digital converters are configured to perform analog-to-digital conversion processing on the N first amplified audio signals to obtain N first digital signals. Likewise, analog amplification processing may be performed on the second initial audio signal using N third amplifiers that have different gain values from each other to obtain N second amplified audio signals. Then, N analog-to-digital converters are configured to perform analog-to-digital conversion processing on the N second amplified audio signals to obtain N second digital signals. Gain values of the N second amplifiers are in a one-to-one correspondence with, and equal to those of the N third amplifiers. Correspondingly, gain values that are of the N first amplified audio signals obtained based on the first initial audio signal and that are relative to the first initial audio signal are in a one-to-one correspondence with, and equal to gain values that are of the N second amplified audio signals obtained based on the second initial audio signal and that are relative to the second initial audio signal. However, this embodiment of the present disclosure is not limited thereto.

To further increase a signal-to-noise ratio of the audio signal, before S320, the method 300 further includes the following step performing audio mixing processing on a first digital signal and a second digital signal that are included in a first digital signal pair to obtain a first optimized digital signal, where the N digital signal pairs include the first digital signal pair, and correspondingly, the determining an unclipped digital signal in the multiple digital signals in S330 includes determining an unclipped digital signal from a digital signal set that is constituted of the first optimized digital signal and another digital signal, where the other digital signal is a digital signal in the multiple digital signals except the first digital signal pair.

In an embodiment, the first digital signal pair may be at least one digital signal pair, and audio mixing processing may be performed on two digital signals that are included in each digital signal pair in the at least one digital signal pair, as so to obtain an optimized digital signal corresponding to each digital signal pair. A signal-to-noise ratio of an optimized digital signal obtained by a digital signal pair is greater than a signal-to-noise ratio of two digital signals included in the digital signal pair. However, this embodiment of the present disclosure is not limited thereto.

The method 300 further includes performing volume balance processing on the output signal such that a signal amplitude of the output signal is within an interval of a human ear comfort amplitude.

The method 300 further includes performing phase synchronization processing on the currently determined output signal if a transmission channel corresponding to the currently determined output signal is different from a transmission channel corresponding to a previously output digital signal such that a phase of the currently determined output signal and a phase of the previously output digital signal are smoothly transited.

According to this embodiment of the present disclosure, the pickup method 300 may be executed by a pickup apparatus in this embodiment of the present disclosure, and various steps of the pickup method 300 may be implemented by various modules and/or functions of a pickup device 200. For clarity, details are not described herein again.

Therefore, according to the pickup method in this embodiment of the present disclosure, at least one initial audio signal is received using at least one microphone, and multiple amplifiers that have different gain values are configured to perform analog amplification processing on an audio signal from a same microphone, the audio signal on which analog amplification processing is performed is converted into a digital signal, an unclipped digital signal is determined from multiple digital signals, and an output signal is determined according to a gain value corresponding to the unclipped digital signal. In this way, in a scenario of a high-volume signal, the pickup apparatus may select, as an output signal, a digital signal corresponding to an amplifier that has a relatively small gain value. In a scenario of a low-volume signal, the pickup apparatus may select, as an output signal, a digital signal corresponding to an amplifier that has a relatively large gain value. Therefore, in various scenarios, the audio signal picked up in the method is not clipped and has an appropriate gain value such that the pickup method may be applied in various pickup scenarios, thereby enhancing user experience.

An embodiment of the present disclosure further provides a method for configuring a pickup apparatus. The method may be executed by any suitable apparatus, where the apparatus may have an interface configured for interaction with a user such that the apparatus may execute the method according to a user instruction. However, this embodiment of the present disclosure is not limited thereto. The method includes determining multiple optional configuration modes of a pickup apparatus, determining a target configuration mode from the multiple optional configuration modes according to an application requirement and a cost constraint condition that are of the pickup apparatus, and configuring the pickup apparatus as the target configuration mode, where in the multiple optional configuration modes, the pickup apparatus includes at least one microphone and multiple amplifiers, where each amplifier in the multiple amplifiers corresponds to one microphone in the at least one microphone, and at least two amplifiers that have different gain values from each other and that are in the multiple amplifiers correspond to a same microphone.

Therefore, according to the method for configuring a pickup apparatus in this embodiment of the present disclosure, a target configuration mode is determined according to an actual need and from pre-determined multiple optional configuration modes respectively corresponding to different application requirements and/or cost constraint conditions such that costs of a configured pickup apparatus are minimized while an application requirement is met, thereby improving user experience.

In different optional configuration modes in the multiple optional configuration modes, at least one parameter in the following parameters of the pickup apparatus is different a quantity of microphones, a type of a microphone, a quantity of amplifiers, and a connection relationship between the microphone and an amplifier.

In the multiple optional configuration modes, the pickup apparatus further includes a limiter, where the limiter is disposed between at least one amplifier in the multiple amplifiers and a microphone respectively corresponding to the at least one amplifier, and is configured to reduce a signal amplitude of an audio signal received by the limiter, and send, to the at least one amplifier, an audio signal whose signal amplitude is reduced.

The determining a target configuration mode from the multiple optional configuration modes according to an application requirement and a cost constraint condition that are of the pickup apparatus includes if the application requirement of the pickup apparatus may be applied in both a scenario of low volume and a scenario of high volume, and the cost constraint condition of the pickup apparatus belongs to a non-strict constraint, determining the target configuration mode as a configuration mode 1, where in the configuration mode 1, the pickup apparatus includes two microphones, a first microphone in the two microphones has high sensitivity, a second microphone in the two microphones has high sound overload pressure, and the at least two amplifiers that have different gain values from each other correspond to the first microphone.

The configuration mode 1 may correspond to the pickup apparatus shown in FIG. 6. However, this embodiment of the present disclosure is not limited thereto. In this case, if sensitivity of the second microphone is relatively low, for example, greater than or equal to −60 dB, the limiter may further be disposed in front of the second microphone in the configuration mode 1 to avoid clipping because an amplitude of an audio signal received by the second microphone exceeds an amplifier corresponding to the second microphone. Correspondingly, as another embodiment, the pickup apparatus further includes a limiter in the configuration mode 1. An input end of the limiter is connected to an output end of the second microphone, and an output end of the limiter is connected to an amplifier corresponding to the second microphone. The limiter is configured to reduce a signal amplitude of an audio signal sent by the second microphone.

The determining a target configuration mode from the multiple optional configuration modes according to an application requirement and a cost constraint condition that are of the pickup apparatus includes if the application requirement of the pickup apparatus may be applied in both a scenario of low volume and a scenario of high volume, and the cost constraint condition of the pickup apparatus belongs to a strict constraint, determining the target configuration mode as a configuration mode 2, where in the configuration mode 2, the pickup apparatus includes a microphone of high sensitivity and high sound overload pressure, a limiter, and multiple amplifiers, and a first output end of the microphone is connected to an input end of the limiter, and an output end of the limiter is connected to an input end of a first amplifier in the multiple amplifiers, and a second output end of the microphone is respectively connected to input ends of the at least two amplifiers that have different gain values from each other, where the at least two amplifiers that have different gain values from each other are another amplifier in the multiple amplifiers except the first amplifier.

The configuration mode 2 may correspond to the pickup apparatus shown in FIG. 5. However, this embodiment of the present disclosure is not limited thereto.

The determining a target configuration mode from the multiple optional configuration modes according to an application requirement and a cost constraint condition that are of the pickup apparatus includes, if the application requirement of the pickup apparatus may be applied in a scenario of low volume, and the cost constraint condition of the pickup apparatus belongs to a non-strict constraint, determining the target configuration mode as a configuration mode 3, where in the configuration mode 3, the pickup apparatus includes two microphones that have a same physical parameter, a first microphone in the two microphones corresponds to N first amplifiers in the multiple amplifiers, a second microphone in the two microphones corresponds to N second amplifiers in the multiple amplifiers, gain values of the N first amplifiers are in a one-to-one correspondence with, and equal to those of the N second amplifiers, and N is an integer greater than 1.

The configuration mode 3 may correspond to the pickup apparatus shown in FIG. 7. However, this embodiment of the present disclosure is not limited thereto.

Therefore, according to the method for configuring a pickup apparatus in this embodiment of the present disclosure, a target configuration mode is determined according to an actual need and from pre-determined multiple optional configuration modes respectively corresponding to different application requirements and/or cost constraint conditions such that costs of a configured pickup apparatus are minimized while an application requirement is met, thereby improving user experience.

In addition, an embodiment of the present disclosure further provides an apparatus for configuring a pickup apparatus, where the apparatus includes a first determining unit configured to determine multiple optional configuration modes of a pickup apparatus, a second determining unit configured to determine, according to an application requirement and a cost constraint condition that are of the pickup apparatus, a target configuration mode from the multiple optional configuration modes determined by the first determining unit, and a configuration unit configured to configure the pickup apparatus as the target configuration mode determined by the second determining unit, where in the multiple optional configuration modes determined by the first determining unit, the pickup apparatus includes at least one microphone and multiple amplifiers, where each amplifier in the multiple amplifiers corresponds to one microphone in the at least one microphone, and at least two amplifiers that have different gain values from each other and that are in the multiple amplifiers correspond to a same microphone.

In different optional configuration modes in the multiple optional configuration modes, at least one parameter in the following parameters of the pickup apparatus is different a quantity of microphones, a type of a microphone, a quantity of amplifiers, and a connection relationship between the microphone and an amplifier.

The apparatus for configuring a pickup apparatus may further include an interactive interface configured to receive a user instruction. Correspondingly, the second determining unit is further configured to determine the application requirement and the cost constraint condition that are of the pickup apparatus according to the user instruction received by the interactive interface. However, this embodiment of the present disclosure is not limited thereto.

Therefore, according to the apparatus for configuring a pickup apparatus in this embodiment of the present disclosure, a target configuration mode is determined according to an actual need and from pre-determined multiple optional configuration modes respectively corresponding to different application requirements and/or cost constraint conditions such that costs of a configured pickup apparatus are minimized while an application requirement is met, thereby improving user experience.

It should be understood that, in this embodiment of the present disclosure, a correspondence between a microphone and an amplifier refers to a correspondence of signal transmission, that is, a microphone sends an audio signal to an amplifier corresponding to the microphone, and correspondingly, an amplifier receives an audio signal sent by a microphone corresponding to the amplifier. However, this embodiment of the present disclosure is not limited thereto.

It should be also understood that sequence numbers of the foregoing processes do not mean execution sequences. The execution sequences of the processes should be determined according to functions and internal logic of the processes, and should not be construed as any limitation on the implementation processes of the embodiments of the present disclosure.

It should be understood that the term "and/or" in this embodiment of the present disclosure describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

Persons of ordinary skill in the art may be aware that, in combination with the examples described in the embodiments disclosed in this specification, method steps and units may be implemented by electronic hardware, computer software, or a combination thereof. To clearly describe the interchangeability between the hardware and the software, the foregoing has generally described steps and compositions of each embodiment according to functions. Whether the functions are performed by hardware or software depends on particular applications and design constraint conditions of the technical solutions. Persons of ordinary skill in the art may use different methods to implement the described functions for each particular application, but it should not be considered that the implementation goes beyond the scope of the present disclosure.

It may be clearly understood by persons skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments of the present disclosure.

In addition, functional units in the embodiments of the present disclosure may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present disclosure essentially, or the part contributing to the prior art, or all or a part of the technical solutions may be implemented in the form of a software product. The software product is stored in a storage medium and includes several instructions for instructing a computer device (which may be a personal computer, a server, or a network device) to perform all or a part of the steps of the methods described in the embodiments of the present disclosure. The foregoing storage medium includes any medium that can store program code, such as a universal serial bus (USB) flash drive, a removable hard disk, a read-only memory (ROM), a random access memory (RAM), a magnetic disk, or an optical disc.

The foregoing descriptions are merely specific embodiments of the present disclosure, but are not intended to limit the protection scope of the present disclosure. Any modification or replacement readily figured out by persons skilled in the art within the technical scope disclosed in the present disclosure shall fall within the protection scope of the present disclosure. Therefore, the protection scope of the present disclosure shall be subject to the protection scope of the claims.

What is claimed is:

1. A pickup apparatus, comprising:
a digital signal processor;
at least one microphone;
a plurality of amplifiers coupled to the at least one microphone; and
a plurality of analog-to-digital converters coupled to the plurality of amplifiers and the digital signal processor,
wherein the plurality of amplifiers are in a one-to-one correspondence with the plurality of analog-to-digital converters,
wherein each amplifier in the plurality of amplifiers corresponds to one microphone in the at least one microphone, wherein at least two amplifiers of the plurality of amplifiers correspond to a same microphone in the at least one microphone,
wherein each of the at least two amplifiers have different gain values from each other,
wherein the at least one microphone is configured to:
  receive an audio signal, and
  send the audio signal to the at least two amplifiers of the plurality of amplifiers corresponding to at least one microphone,
wherein each of the at least two amplifiers is configured to:
  amplify the received audio signal to obtain an amplified audio signal, and
  send the amplified audio signal to an analog-to-digital converter of the plurality of analog to digital converters corresponding to each amplifier,
wherein at least two analog-to-digital converters of the plurality of analog-to-digital converters is configured to:
  convert the received audio signal into a digital signal, and
  send the digital signal to the digital signal processor, and
wherein the digital signal processor is configured to:
  receive at least two digital signals from the at least two analog-to-digital converters,
  select a plurality of digital signals from the at least two digital signals, wherein the plurality of digital signals are unclipped digital signals, and
  select one of the plurality of digital signals as the output signal based on a gain value of each of the plurality of digital signals after selecting the plurality of digital signals from the at least two digital signals, wherein the output signal that is selected has a maximum gain value and is unclipped.

2. The apparatus according to claim 1, further comprising a limiter, wherein two ends of the limiter are coupled to at least one of in the plurality of amplifiers and the at least one microphone corresponding to the at least one amplifier, wherein the limiter is configured to:
  receive the audio signal from the at least one microphone connected to the limiter;
  reduce the signal amplitude of the received audio signal; and
  send the audio signal whose signal amplitude is reduced to the at least one amplifier connected to the limiter, and
wherein the at least one amplifier is configured to receive the audio signal whose signal amplitude is reduced and that is from the limiter respectively connected to the at least one amplifier.

3. The apparatus according to claim 2, wherein the at least one microphone is a first microphone, and wherein the first microphone has high sensitivity and high sound overload pressure.

4. The apparatus according to claim 3, wherein two ends of the limiter are coupled to the first microphone and a first amplifier corresponding to the first amplifier, wherein the plurality of amplifiers comprise the first amplifier, wherein the first microphone is directly connected to at least two other amplifiers of the plurality of amplifiers except the first amplifier, and wherein any two amplifiers in the at least other two amplifiers have different gain values.

5. The apparatus according to claim 1, wherein the at least one microphone comprises a second microphone and a third microphone, wherein the second microphone has high sensitivity, wherein the third microphone has high sound overload pressure, and wherein the at least two amplifiers correspond to the second microphone.

6. The apparatus according to claim 1, wherein the at least one microphone comprises a fourth microphone and a fifth microphone, wherein the fourth microphone and the fifth microphone have a same physical parameter, wherein N second amplifiers of the plurality of amplifiers that have different gain values from each other correspond to the fourth microphone, wherein N third amplifiers of the plurality of amplifiers that have different gain values from each other and that are in the plurality of amplifiers correspond to the fifth microphone, wherein the N second amplifiers and the N third amplifiers constitute N amplifier pairs, wherein each amplifier pair in the N amplifier pairs comprises one second amplifier and one third amplifier that have a same gain value, and wherein N is an integer greater than 1.

7. The apparatus according to claim 6, wherein the digital signal processor is further configured to:
  perform audio mixing on a first digital signal pair in the multiple received digital signals to obtain an optimized digital signal, wherein the first digital signal pair comprises digital signals respectively corresponding to a second amplifier and a third amplifier that are comprised in a first amplifier pair, and wherein the N amplifier pairs comprise the first amplifier pair; and
  determine an unclipped digital signal from a digital signal set that comprises the optimized digital signal and another digital signal, wherein the other digital signal is a digital signal in the multiple digital signals except the first digital signal pair.

8. The apparatus according to claim 1, wherein the digital signal processor is further configured to perform volume balance processing on the output signal such that a signal amplitude of the output signal is within an interval of a human ear comfort amplitude.

9. A pickup method, comprising:
  receiving, by at least one microphone, at least one initial audio signal;
  performing, by at least one amplifier and at least one analog-to-digital converter, analog amplification processing and analog-to-digital conversion processing on the at least one initial audio signal to obtain a plurality of digital signals, wherein the plurality of digital signals comprise at least two digital signals obtained by a first initial audio signal in the at least one initial audio signal, and wherein gain values that are of any two digital signals in the at least two digital signals and that are relative to the first initial audio signal are different;
  selecting, by a digital signal processor, a plurality of digital signals from the at least two digital signals, wherein the plurality of digital signals are unclipped digital signals; and
  selecting, by the digit signal processor, one of the plurality of digital signals as the output signal based on a gain value of each of the plurality of digital signals after selecting the plurality of digital signals from the at least two digital signals, wherein the output signal that is selected has a maximum gain value and is unclipped.

10. The method according to claim 9, wherein before performing analog amplification processing and analog-to-digital conversion processing on the at least one initial audio signal to obtain the plurality of digital signals, the method further comprises reducing signal amplitudes of one or more signals in the at least one initial audio signal, and wherein performing analog amplification processing and analog-to-digital conversion processing on the at least one initial audio signal comprises performing analog amplification processing and analog-to-digital conversion processing on the at least one initial audio signal in which the signal amplitudes of the one or more signals are reduced to obtain the plurality of digital signals.

11. The method according to claim 9, wherein the at least one initial audio signal further comprises a second initial audio signal the same as the first initial audio signal, wherein performing analog amplification processing and analog-to-digital conversion processing on the at least one initial audio signal to obtain the plurality of digital signals comprises:
performing analog amplification processing and analog-to-digital conversion processing on the first initial audio signal to obtain N first digital signals; and
performing analog amplification processing and analog-to-digital conversion processing on the second initial audio signal to obtain N second digital signals, wherein the N first digital signals and the N second digital signals constitute N digital signal pairs, wherein each digital signal pair in the N digital signal pairs comprises one first digital signal and one second digital signal that correspond to a same gain value, and wherein N is an integer greater than 1.

12. The method according to claim 11, wherein the method further comprises:
performing audio mixing processing on a first digital signal and a second digital signal that are comprised in a first digital signal pair to obtain a first optimized digital signal, wherein the N digital signal pairs comprise the first digital signal pair; and
determining an unclipped digital signal from a digital signal set that comprises the first optimized digital signal and another digital signal, and wherein the other digital signal is a digital signal in the multiple digital signals except the first digital signal pair.

13. The method according to claim 9, wherein the method further comprises performing volume balance processing on the output signal such that the signal amplitude of the output signal is within an interval of a human ear comfort amplitude.

14. A device, comprising:
at least one microphone configured to receive an audio signal;
a plurality of amplifiers coupled to the at least one microphone, wherein the plurality of amplifiers comprise at least two amplifiers, and wherein each of the plurality of amplifiers are configured to:
receive the audio signals from the at least one microphone, wherein the at least one microphone corresponds to the plurality of amplifiers; and
amplify the audio signal to obtain an amplified audio signal; and
a plurality of analog-to-digital converters, wherein the plurality of analog-to-digital converters comprise at least two analog-to-digital converters coupled to the at least two amplifiers, and wherein each of the analog-to-digital converters are configured to convert the received audio signal into a digital signal; and
a digital signal processor coupled to the analog-to-digital converters, wherein the digital signal processor is configured to:
receive at least two digital signals from the analog-to-digital converters,
select a plurality of digital signals from the at least two digital signals, wherein the plurality of digital signals are unclipped digital signals, and
selecting one of the plurality of digital signals as the output signal based on a gain value of each of the plurality of digital signals after selecting the plurality of digital signals from the at least two digital signals, wherein the output signal that is selected has a maximum gain value and is unclipped.

15. The device according to claim 14, wherein the digital signal processor is further configured to select, as the output signal, the digital signal that corresponds to minimum gain value.

16. The device according to claim 14, further comprising at least one limiter, wherein at a first end of the limiter is connected to the amplifiers, wherein a second end of the limiter is connected to the at least one microphone, and wherein the limiter is configured to reduce the signal amplitude of the received audio signal.

17. The device according to claim 16, wherein at least one of the at least two amplifiers is configured to receive the audio signal with a reduced signal amplitude that is from the limiter.

* * * * *

UNITED STATES PATENT AND TRADEMARK OFFICE
CERTIFICATE OF CORRECTION

PATENT NO. : 10,015,591 B2
APPLICATION NO. : 15/383167
DATED : July 3, 2018
INVENTOR(S) : Yulong Li et al.

Page 1 of 1

It is certified that error appears in the above-identified patent and that said Letters Patent is hereby corrected as shown below:

On the Title Page

Item (30), Line 1: "201410277225" should be "201410277225.1"

In the Claims

Column 24, Line 53: "digit" should be "digital"

Signed and Sealed this
Twenty-first Day of August, 2018

Andrei Iancu
*Director of the United States Patent and Trademark Office*